United States Patent
Nuytkens et al.

(10) Patent No.: US 6,696,910 B2
(45) Date of Patent: Feb. 24, 2004

(54) PLANAR INDUCTORS AND METHOD OF MANUFACTURING THEREOF

(75) Inventors: Peter R. Nuytkens, Melrose, MA (US); Ilya E. Popeko, Forest Hills, NY (US); Joseph M. Kulinets, Stamford, CT (US)

(73) Assignee: Custom One Design, Inc., Melrose, MA (US)

( * ) Notice: Subject to any disclaimer, the term of this patent is extended or adjusted under 35 U.S.C. 154(b) by 0 days.

(21) Appl. No.: 09/904,014

(22) Filed: Jul. 12, 2001

(65) Prior Publication Data

US 2003/0011458 A1 Jan. 16, 2003

(51) Int. Cl.⁷ .................................................. H01F 5/00
(52) U.S. Cl. ..................... 336/200; 336/232; 336/223; 29/602.1
(58) Field of Search ................................ 336/200, 212, 336/223, 232; 29/602.1

(56) References Cited

U.S. PATENT DOCUMENTS

| | | | |
|---|---|---|---|
| 5,430,613 A | * | 7/1995 | Hastings et al. ............. 361/760 |
| 5,781,077 A | * | 7/1998 | Leitch et al. ................ 332/117 |
| 5,959,846 A | * | 9/1999 | Noguchi et al. ............. 361/748 |

* cited by examiner

Primary Examiner—Anh Mai
(74) Attorney, Agent, or Firm—Perkins, Smith & Cohen LLP; Jacob N. Erlich

(57) ABSTRACT

A printed circuit board has two layers of printed circuit board dielectric material; a core made of ferromagnetic material between the two layers; and conductive leads on the opposite side of each dielectric layer from the core connected by via holes through both dielectric layers to form a conducting coil around the core. The conductive leads can form two separate coils around the core to form a transformer. A planar conducing sheet can be placed on or between one or more of the printed circuit board's dielectric layers to shield other circuitry on the printed circuit board from magnetic fields generated around the core. The core can be formed at least in part by electroless plating. Electroplating can be used to add a thicker layer of less conductive ferromagnetic material. Ferromagnetic inductive cores can be formed on the surface of a dielectric material by: dipping the surface of the dielectric in a solution containing catalytic metal particles having a slight dipole; and placing the dielectric in a metal salt to cause a layer containing metal to be electrolessly plated upon the dielectric. Plasma etching or other technique can be used before the dipping process to roughen the dielectric's surface to help attract the catalytic particles. This method can be used to form an inductor core on or between one or more dielectric layers of a printed circuit board, of a multichip module, of an integrated circuit, or of a micro-electromechanical device.

13 Claims, 10 Drawing Sheets

PLANAR INDUCTORS AND METHOD OF MANUFACTURING THEREOF

BACKGROUND OF THE INVENTION

The present invention relates to planar conductors for use in printed circuit boards, multichip modules, and integrated circuits, and micro electromechanical devices—and methods for making such inductors.

Devices having inductive cores are important in electric and electronic apparatuses. Such devices include transformers, inductors, and electromagnets. In the past it is been relatively difficult and expensive to produce inductive devices of the scale appropriate for use in many printed circuit boards, multichip modules, integrated circuits, or micro electromechanical ("MEM") devices. In the past such small inductive devices usually have been fabricated using a variety of mechanical operations. These operations have included stamping, or micromachining ferromagnetic materials suitable for use in as cores and then winding primary and/or secondary coils around them. Usually such prior art inductive devices have been separate units that have to be individually mounted upon printed circuit boards or multichip modules. Such devices are often much larger in volume than many other electronic devices and, thus, it has long been a desire to reduce the size of such inductive devices.

In the prior art there has been some creation of ferromagnetic cores upon integrated circuits for use in the micro electromechanical devices. In the past most such ferromagnetic cores have been deposited on the MEM devices by sputtering, which is a relatively expensive, time-consuming, and high-temperature process. The high-temperature of sputtering processes makes them impossible to use on many types of substrates or dielectrics.

It is an object of the present invention to provide inductive cores for use in inductors, transformers, and electromagnets which can be manufactured inexpensively, which consume relatively little space, and/or which can be formed on many different substrates.

SUMMARY OF THE INVENTION

According to a first aspect of the present invention a printed circuit board is provided comprised of two layers of printed circuit board dielectric material; a core made of ferromagnetic material between the two layers; and conductive leads on the opposite side of each dielectric layer from the core which are connected by via holes through both dielectric layers so as to form a conducting coil around the core.

In some embodiments of this aspect of the invention the conductive leads form two separate coils around the same core so that one such coil can act as a primary winding and the other can act as a secondary winding of a transformer.

In some embodiments a planar conducing sheet is placed on or between one or more of the printed circuit board's dielectric layers so as to shield other circuitry on the printed circuit board from magnetic fields generated around the core.

In some embodiments the core is formed of two separate layers of ferromagnetic material, each formed at a corresponding location on a facing side of one of said two dielectric layers.

In some embodiments the core has been formed at least in part by electroless plating on one or both of said dielectric layers. In some such embodiments the core has been deposited on one or more of dielectric layers by the following process: dipping the surface of the dielectric material in a solution containing catalytic metal particles which have a slight electrostatic dipole when in solution to help those particles attach to the dielectric material's surface; and placing the surface of the dielectric material in a first metal salt solution in metastable equilibrium with a reducing agent so as to cause a first layer containing metal to be plated upon the surface of the dielectric material containing the catalytic metal particles by a process of electroless plating. The electroless plating process can further include, before dipping the dielectric material in the solution of catalytic metal particles, plasma etching the surface of the dielectric material to roughen its surface and to create peaks and valleys in the surface of that material which have van der Waal forces capable of attracting catalytic particles which have a slight electrostatic dipole. Such etching is not necessary if the surface of the material upon which the cores the deposited already has a texture which generates the appropriate van der Waal forces. For example FR4, in material commonly used makes layers are printed circuit boards usually has a texture which is not require such etching to prepare it for the electroless plating process.

In some embodiments of this aspect of the invention the first layer put down at the start of the electroless plating process is thin layer of relatively conductive metallic material used as a seed layer. This is often done because more metallic, and thus more conducting, materials often, are more easily prompted out of the metastable solution by the catalytic particles.

In such embodiments once such a thin seed layer has been established the surface of the dielectric material can then be placed in a second metal salt solution in metastable equilibrium with a reducing agent which has a higher concentration of non-metal elements than the first solution so as to cause material to be plated upon the seed layer which is a ferromagnetic material having a lower conductivity than the material of the seed layer.

In some embodiments such a relatively conductive seed layer is used as an electrode so that electroplating can be used to plate a thicker layer of less conductive ferromagnetic material onto the seed layer.

According to another aspect of the present invention a method is provided of forming ferromagnetic inductive cores on the surface of a dielectric material. This method comprises the following: dipping the surface of the dielectric material in a solution containing catalytic metal particles which have a slight electrostatic dipole when in solution to help those particles attach to the dielectric material's surface; and placing the surface of the dielectric material in a first metal salt solution in metastable equilibrium with a reducing agent so as to cause a first layer containing metal to be plated upon the surface of the dielectric material containing the catalytic metal particles by a process of electroless plating.

Some embodiments of this method further include, before dipping the dielectric material in the solution of catalytic metal particles, plasma etching the surface of the dielectric material to roughen its surface and to create peaks and valleys in the surface of that material which have van der Waal forces capable of attracting catalytic particles which have a slight electrostatic dipole. As stated above such plasma etching is not always necessary because some materials upon which such cores are deposited already have the proper surface roughness. In other embodiments of the indention where the material needs roughening other methods of roughening the surface can be used including chemical etch and/or mechanical abrasion. When a plasma etch is used for this purpose it is commonly a non-reactive ion etch.

In some embodiments of this method the ferromagnetic material deposited is phosphorous doped nickel. In others the ferromagnetic material is boron doped nickel.

In some embodiments of this method the catalytic particles are particles of one of the following metals: cobalt, palladium, ruthenium, rhodium, platinum, iridium, osmium, nickel, or iron.

According to another aspect of the present invention a method of forming ferromagnetic inductive cores on the surface of a dielectric material is provided. This method comprises the following steps: dipping the surface of the dielectric material in a solution containing catalytic metal particles which have a slight electrostatic dipole when in solution to help those particles attach to the dielectic material's surface; and placing the surface of the dielectric material in a first metal salt solution in metastable equilibrium with a reducing agent so as to cause a first layer containing metal to be plated upon the surface of the dielectric material containing the catalytic metal particles by a process of electroless plating.

Some embodiments of this method further include the plasma etching process described above.

Some embodiments of this method change the metal salt solution used in the electroless plating process after a first relatively conductive thin seed layer has been deposited to one which will cause the subsequently deposited material to have a lower conductivity than the seed layer, as has been discussed above.

Some embodiments of this method used such a thin relatively conductive seed layer as an electrode upon which to plate less conductive from magnetic material, as has also been discussed above.

This method can be used to form an inductor core on or between one or more dielectric layers of a printed circuit board, of a multichip module, of an integrated circuit, or of a micro-electromechanical device in which the inductor is used to provide electromagnectically induced movement to a mechanical element of that device.

DESCRIPTION OF THE DRAWINGS

These and other aspects of the present invention will become more evident upon reading the following description of the preferred embodiment in conjunction with the accompanying drawings, in which.

Figure 23:
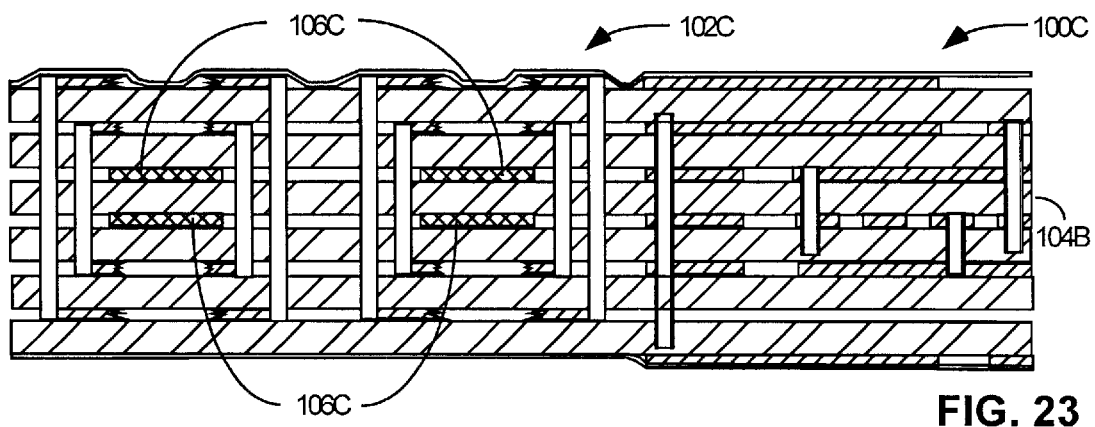
FIG. 23 is a schematic cross-sectional view of a printed circuit board which is similar to that shown in FIG. 22 except that its magnetic core is formed of layers which are separated by a layer of the printed circuit board.
Figure 24:
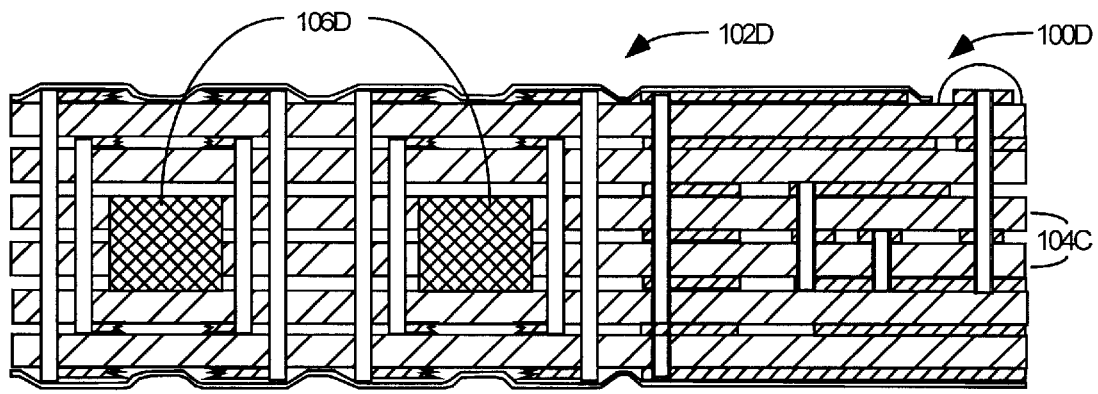
Figure 25:
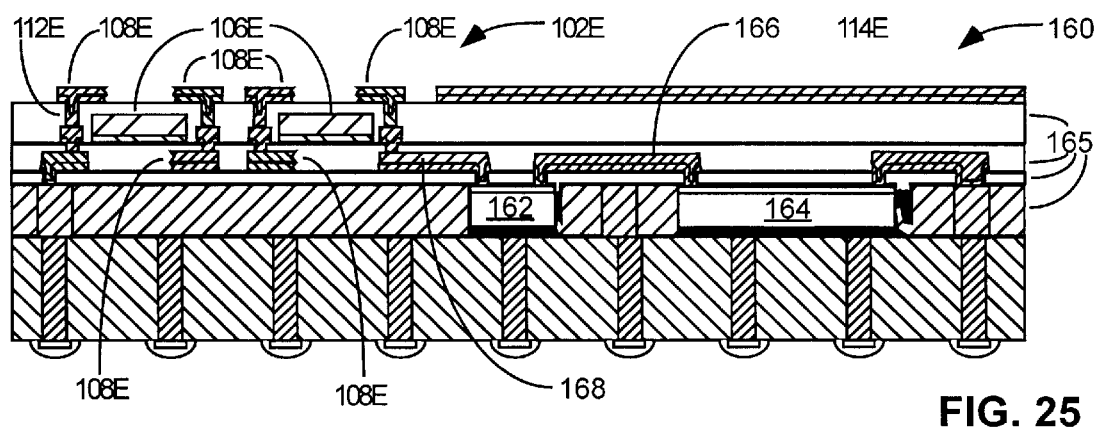
Figure 26:
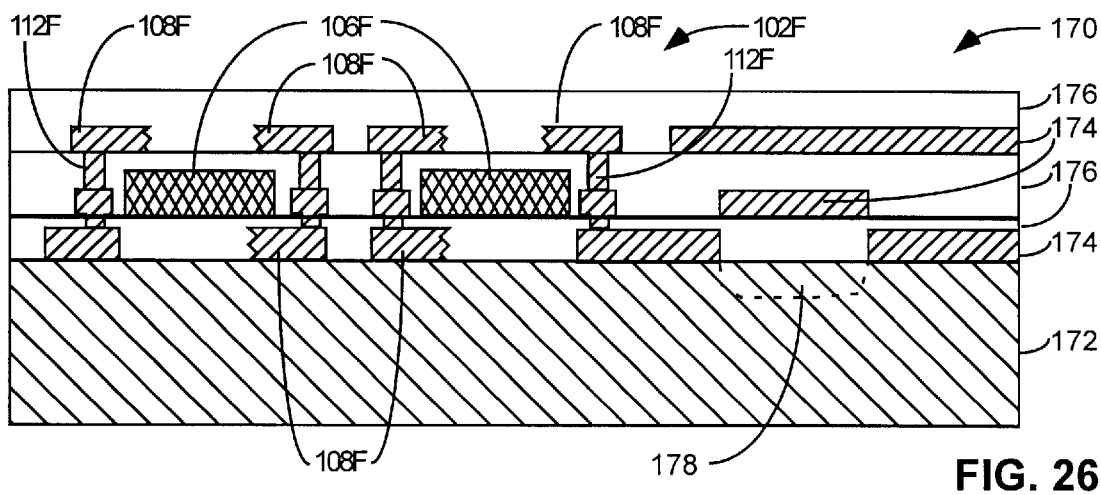
Figure 27:
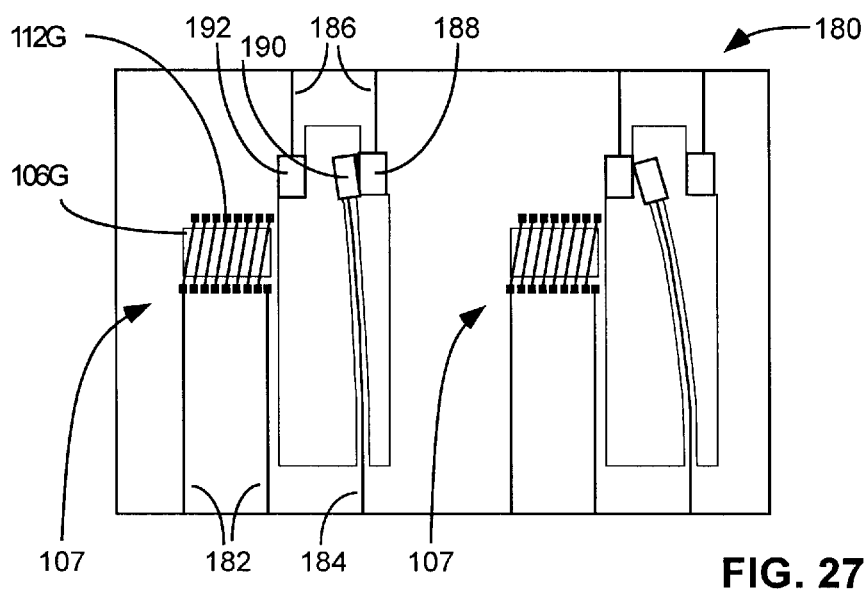

FIG. 24 is a schematic cross-sectional view of a printed circuit board which is similar to that shown in FIG. 23 except that its inductive core extends across a width of more than one printed circuit board layer;

FIG. 25 is a schematic cross-sectional view of a multichip module which includes a planar inductor;

FIG. 26 is a schematic cross-sectional view of an integrated circuit which includes a planar inductor; and FIG. 27 is a schematic top view of a micro electromechanical ("MEM") device that includes planar inductors to provide magnetically induced motion to certain of its components.

DETAILED DESCRIPTION OF PREFERRED EMBODIMENTS

FIGS. one through 5 illustrate a prototype planar inductor 102 which is been built into a two layer printed circuit board 100. This inductor is of transformer having electrical properties making it suited for use in a range from approximately 100 kHz to hundreds of megahertz. In other embodiments of the invention the planar conductive cores could be of different sizes and have different number and types of windings making them suitable for use at different frequencies.

Figure 1:
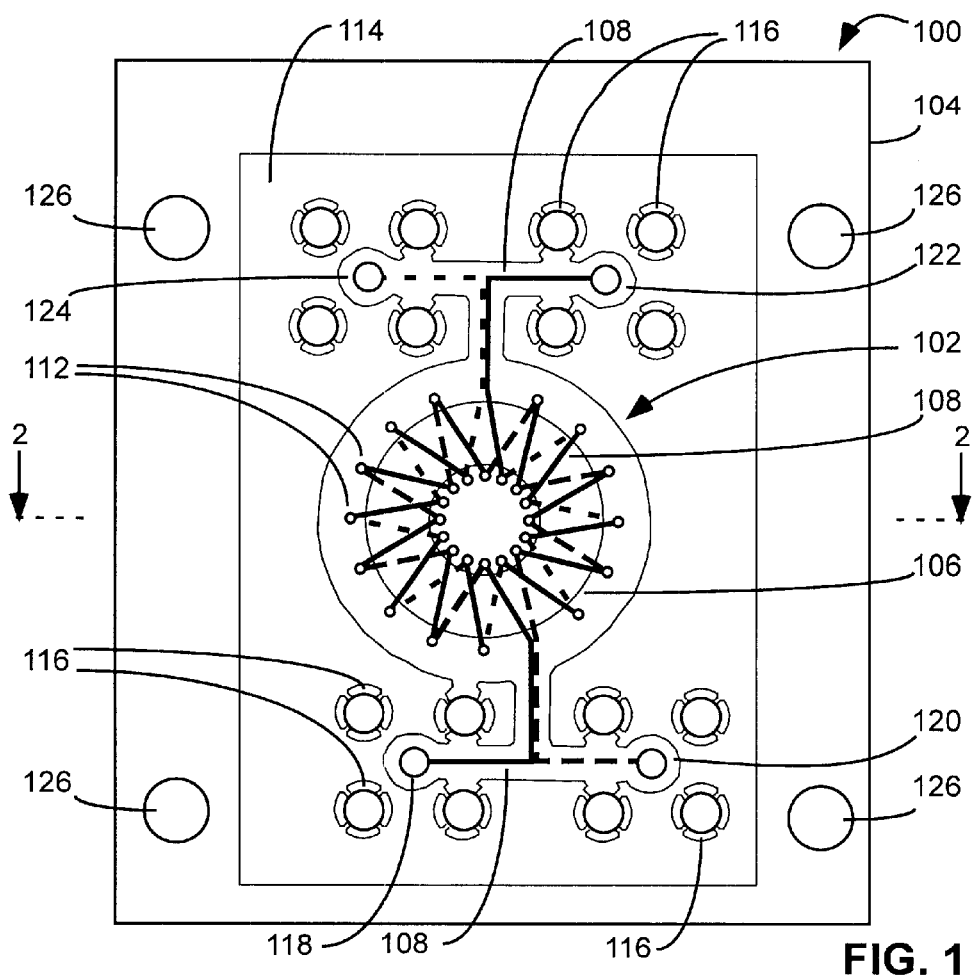
FIG. 1 is a top view of a of a printed circuit board including a prototype of a planar inductor made according to one embodiment of the invention, in which leads on the opposite side of the printed circuit board are shown in dotted lines.

FIG. 1 is a top view of this assembly that shows its top layer 104 and its inductive core 106. This figure also shows the top layer 108 of the inductors wiring, which are shown in solid lines. The via holes 112 are used to electrically connect between the inductor's wiring on its top and bottom layers. The conductive ground plane 114 is used to provide shielding from the electromagnetic fields generated by the inductor. The via hole 118 provides a connection on the top layer of the print circuit board to the wiring which forms the inductor's primary coil. The via hole 120 connects on the print circuit boards bottom layer to the other end of that primary coil. The wiring of the primary coil that occurs on the bottom side of the bottom layer of the printed circuit board is shown in FIG. 1 by a dotted line having relatively long dots. The via hole 122 in FIG. 1 connects to a lead on the top layer of the printed circuit board which is connected to the secondary coil of the inductor. The via hole 124 is connected to a lead on the bottom side of the printed circuit board which is connected to the opposite end of the secondary coil. In FIG. 1 the wiring of the secondary coil which is on the bottom side of the printed circuit board is shown by a dotted line with relatively short dots. The holes 126 are screw holes that are used to connect together the two layers of this prototype printed circuit board.

Figure 2:
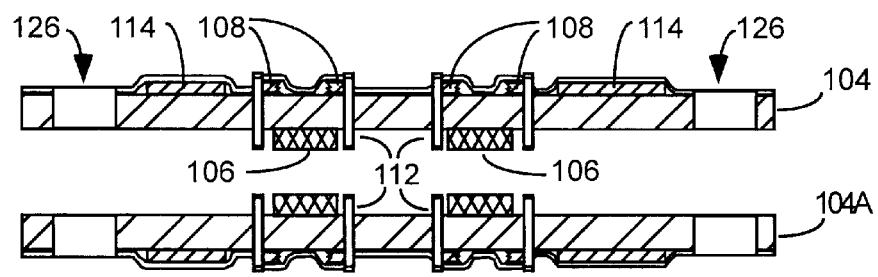
FIG. 2 is a schematic cross-sectional view of the printed circuit board shown in FIG. 1 taken along the lines 2—2 shown in FIG. 1 with the two main layers of the print circuit board being separated.

FIG. 2 is a schematic cross-sectional view of the print circuit board shown in FIG. 1. It illustrates the print circuit board's top layer 104, and a substantially identical bottom layer 104A. In this cross-sectional view the vertical dimension has been exaggerated tremendously. For example, in one current embodiment of this prototype the ferromagnetic core 106 is only 0.0003 inches thick, with half of that thickness contributed by the portion of the core on the layer 104 in the other half contributed by the portion on the layer 104A.

Figure 3:
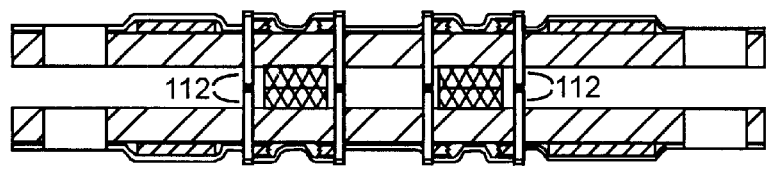
FIG. 3 is a schematic cross-sectional view similar to that of FIG. 2 except that it shows the to layers of the circuit board joined together.

FIG. 3 is identical to FIG. 2, except that in it the two layers are shown pressed against each other so that that the via holes between the portions of the primary and secondary coil on the top and bottom layers are connected. To enhance the conduction between the via holes on the top and bottom layers standard techniques for connecting between via holes can be used, such as inserting a metal wire down through the cylindrical hole formed by abutting via holes on the different layers, or by inserting solder or other conduct conducted material into them.

Figure 4:
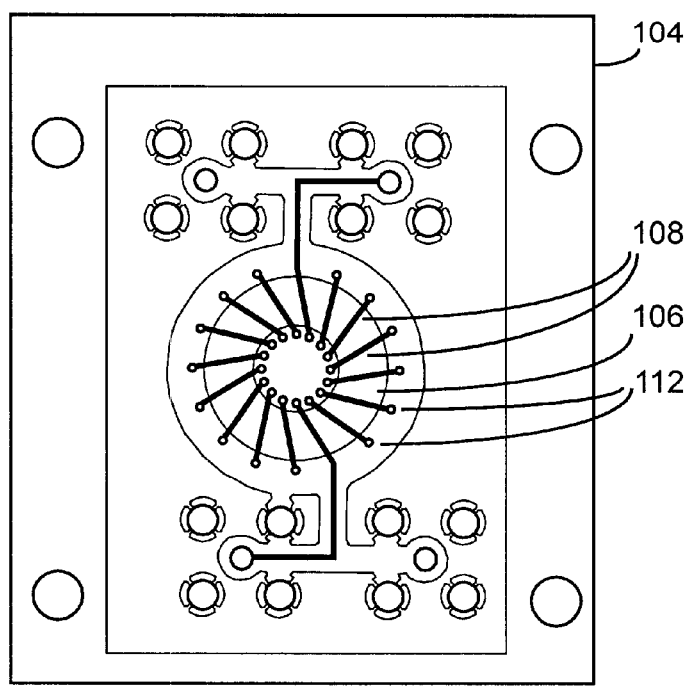
FIG. 4 is a top view of the top layer of the printed circuit board shown in FIG. 1.

FIG. 4 is a top view the top layer 104 of the printed circuit board shown in FIG. 1. Is identical to FIG. 1 except that it does not attempt to show the path of the wiring on the opposite side of the board.

Figure 5:
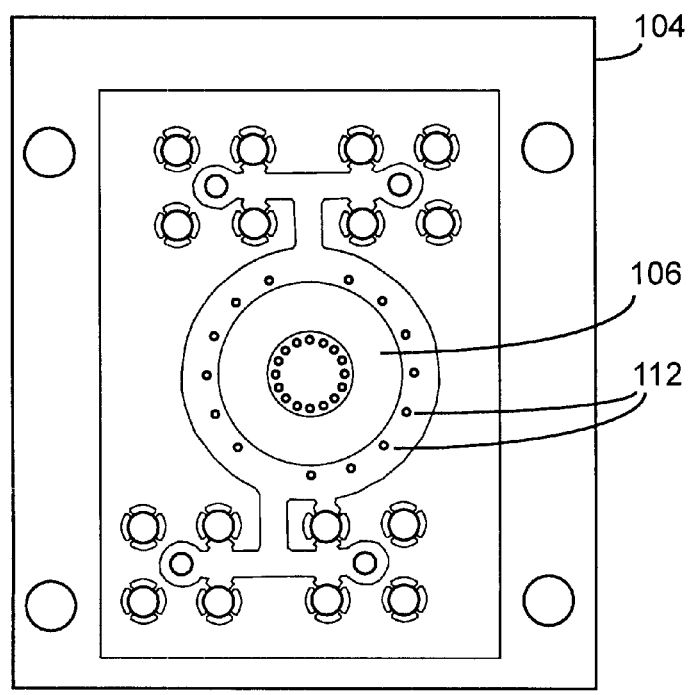
FIG. 5 is a bottom view of the top layer of the print circuit board shown in FIG. 1.

FIG. 5 is a bottom view of the top layer 104 shown in FIG. 4. It provides a good illustration of the ferromagnetic inductive core 106 which has been plated on the bottom of the dielectric layer 104 and of the via holes 112 which extend down from the top of that layer to its bottom face.

In the prototype shown in FIGS. 1 through 5 the printed circuit board layers are made of FR4, a commonly used printed circuit board dielectric layer material. In other embodiments of the invention, virtually any other type of dielectric material used in printed circuit boards can be used as a substrate on which to form a ferromagnetic inductive core.

Figure 9:
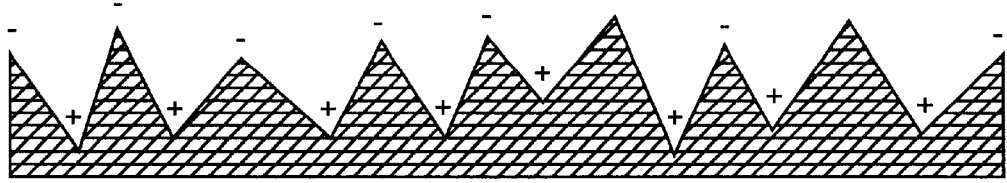
FIG. 9 is a schematic representation of the surface of a dielectric layer which has a texture of fine peaks and valleys capable of generating van der Waal forces.

Sheets of FR4 material of the type commonly used in many printed circuit boards often have a relatively fine grain roughness on their surface, similar to that represented schematically in FIG. 9, which causes electric fields to be generated between their peaks 130 and valleys 132. These fields are generated because of the tendency of negative charge to predominate on the peaks and positive charge to predominate in the valleys. This difference in electric fields generates van der Waal forces which help a layer of material to be deposited on to that surface and help cause that layer to adhere once deposited.

Figure 6:
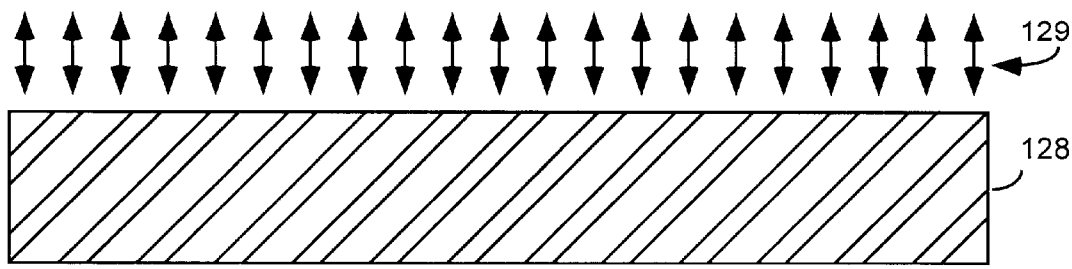
FIG. 6 is a schematic representation of an entire surface of a dielectric layer being submitted to a plasma etch so as to roughen its surface in preparation for electroless plating.

If it is desirous deposit a ferromagnetic planar core upon material, such as, for example, polyimide, Teflon, or latex, which does not have the type of fine grain roughness shown in FIG. 9, the process shown in FIG. 6 can be used to give it such a surface texture.

FIG. 6 shows the surface of a dielectric layer 128 being submitted to a relatively brief non-reactive ion etch. It is preferred that a non-reactive etch be used in which the ions bombard against the dielectric surface are inert chemicals, such as Argon. This is because, unlike the etching that is commonly performed in photolithography to eat all the way through portions of certain layers, in the process of FIG. 6 the purpose is only to create the relatively small peaks 130 and valleys 132 shown schematically in FIG. 9. The use of inert chemicals in ion etch is somewhat analogous to sand blasting the surface of the dielectric 128 with the equivalent of very fine sand, i.e., atomic sized ion particles.

In FIG. 6 the ion etch 129 has been applied to the entire top surface of the layer 128. This is desirable when electroplating will be used to form one or more inductive cores, since electroplating is often formed using a seed conductive layer which extends across the entire surface of a dielectric, as will be described above with regard to FIGS. 13 through 18.

In many embodiments, such a surface wide conducted seed layer is either unnecessary or undesirable. This is often the case when the ferromagnetic inductive core will be formed entirely through electroless plating. In such cases the ion etching 129, if needed, can be applied through a pattern photolithographic mask 131, as illustrated in FIG. 7 so as to roughen up only those portions of the surface 128 were electroless plating is to take place.

Once all, or desired portions, of the dielectric surface have the appropriate roughness to generate desired van the Waal forces, the surface will be placed in a solution containing metal catalyst particles which will be used to help the electroless plating process.

Figure 7:
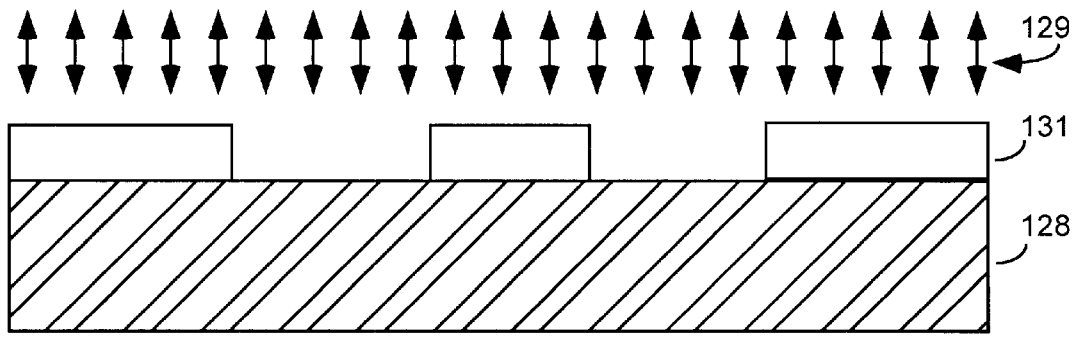
FIG. 7 is a schematic representation similar to that of FIG. 6, except that in it the dielectric surface is being submitted to the plasma etch through a patterned layer of photoresist.
Figure 8:
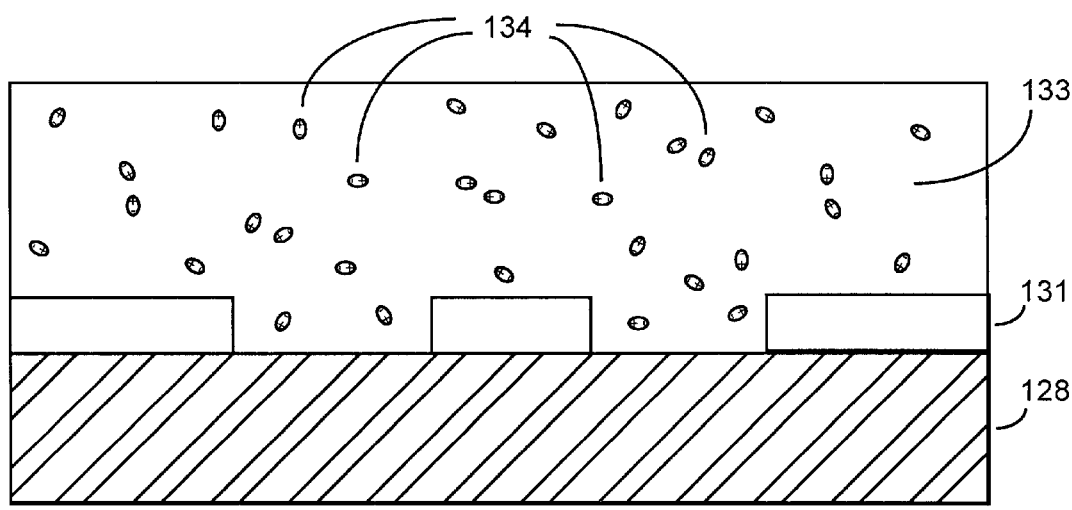
FIG. 8 is a schematic representation of the dielectric surface shown in FIG. 7 being dipped in a solution containing catalyst particles used to promote electroless plating.

FIG. 8 schematically represents a step in which the surface of the assembly shown in FIG. 7 is dipped into a tin chloride solution 133 in which very fine metallic palladium particles 134 are suspended. Preferably the metal particles are quite small, containing only two to six atoms. The tin chloride stabilizes these particles, preventing them from conglomerating into larger particles and precipitating.

In other embodiments of the invention the catalytic particles used can be made of any metal in the eighth group on periodic table. This group includes cobalt, palladium, ruthenium, rhodium, platinum, iridium, osmium, nickel, and iron. And in other embodiments other chemicals can be used to keep the catalytic particles from undesirably conglomerating.

Figure 10:
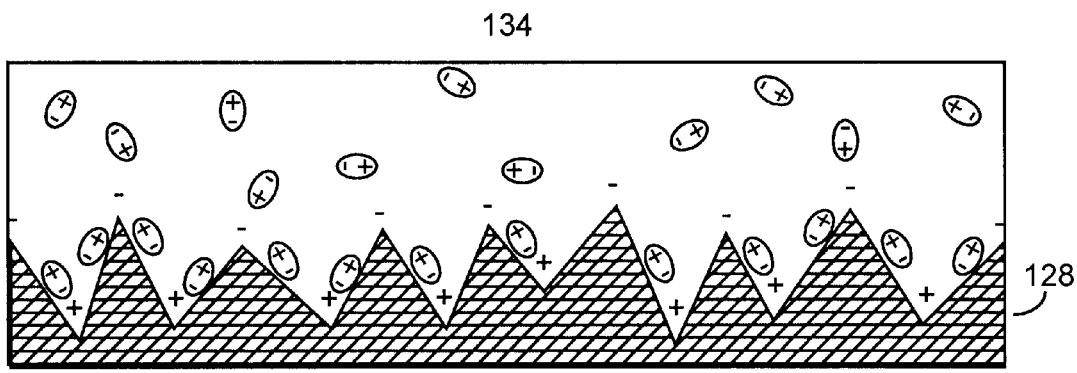
FIG. 10 is a schematic representation of the surface shown in FIG. 9 placed in a solution containing catalytic metal particles shown in FIG. 8.

FIG. 10 is a schematic enlarged view showing how the van der Waal forces of the surface shown in FIG. 9 interact with the catalytic particles in the solution 133. In such a solution the palladium particles and the water molecules that surround them tend to have a slight dipole moment, as is indicated by the plus and minus signs shown on the particles 134 in FIG. 10. This causes those particles to be attracted to the opposite dipole field which exists between the peaks 130 and the valleys 132 in the roughened surface of the dielectric 128. This is indicated in FIG. 10 by the attachment of many of the particles 134 to the dielectric surface between those peaks and valleys.

Figure 11:
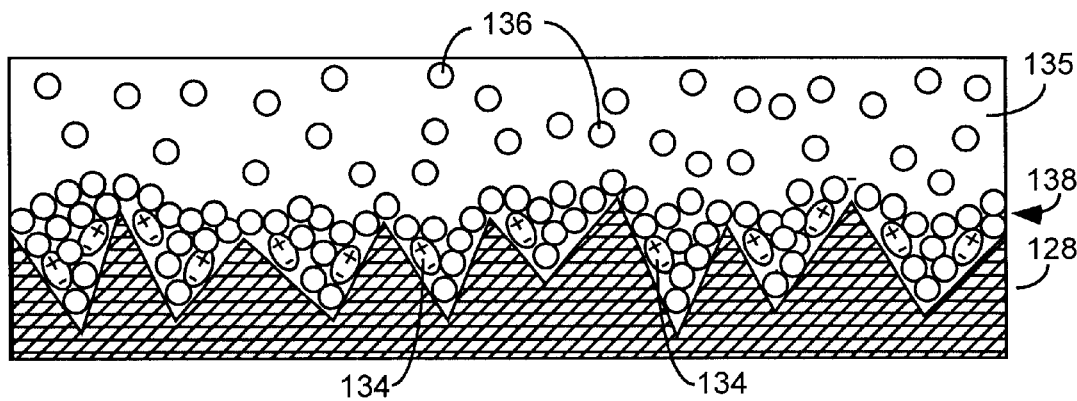
FIG. 11 is a schematic representation of the surface shown in FIG. 10 after it has been placed in a metastable metal salt solution, which causes a metal alloy to start plating upon the surface.

Once the surface of the dielectric has been seeded with the metal palladium particles 134, that surface is removed from the solution 133 and placed in a solution 135 shown in FIG. 11. The solution 135 is a metal salt solution in which the metal salt is in a metastable equilibrium with a reducing agent that causes the metal in the solution to be near the verge of precipitating. One such solution that can be used to form ferromagnetic cores is a nickel sulfate solution with sodium hypophosphate used as a reducing agent. The presence of the palladium particles 134 attached to the dielectric surface causes nickel atoms 136 and some phosphorus atoms (not shown) to be plated upon the palladium. This formed a thin initial largely nickel layer to be deposited upon the dielectric surface.

The purity of the metal layer deposited by the process shown in FIG. 11 can be varied from embodiment to embodiment. Where the seed layer is to be used as an electrode for electroplating it is desirable that its have a reasonable conductivity. It is also easier to make a relatively pure nickel layer deposit upon the catalytic particles shown in FIG. 10 than it is a less conductive alloy. For this reason the first portion of material deposited by electroless plating upon the catalytic particles shown in FIG. 10 tends to be relatively conductive in many embodiments of the invention.

Figure 12:
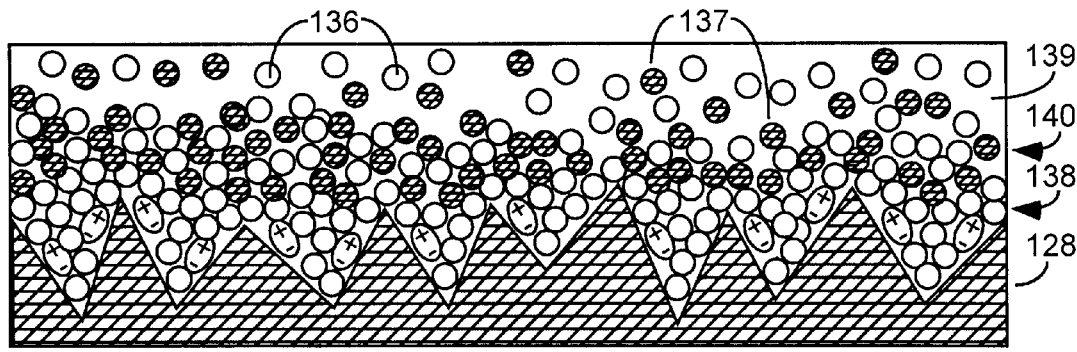
FIG. 12 is a schematic representation of the surface shown in FIG. 11 after it has been placed in a metastable metal salt solution that contains a higher concentration of alloying elements than the solution shown in FIG. 11 so as to reduce the conductivity of the ferromagnetic material which is subsequently deposited upon the dielectric surface.

FIG. 12 illustrates that once an initial layer of nickel has been deposited upon the palladium particles on the dielectric surface it is preferable to dip the dielectric surface in a solution 139 which contains a higher concentration of a less conductive material, such as the phosphorus atoms 137 shown in FIG. 12. This is done to cause the subsequently deposited materials to have a lower conductivity than the relatively more pure nickel which is used to establish an initial layer that form an autocatalyst to encourage further deposition. This is done to reduce the tendency of energy sapping eddy current to form in such a core. In one embodiment of the invention, the nickel phosphorus alloy used to form the main thickness of core has approximately 7 to 9 percent phosphorus, and as a result has a conductivity approximately 100,000 times less them that of copper. The inventors are working on creating platable ferromagnetic material with even much lower conductivity.

In other embodiments of the invention other ferromagnetic materials can be deposited by electroless deposition, including nickel boron alloys.

Figure 13:
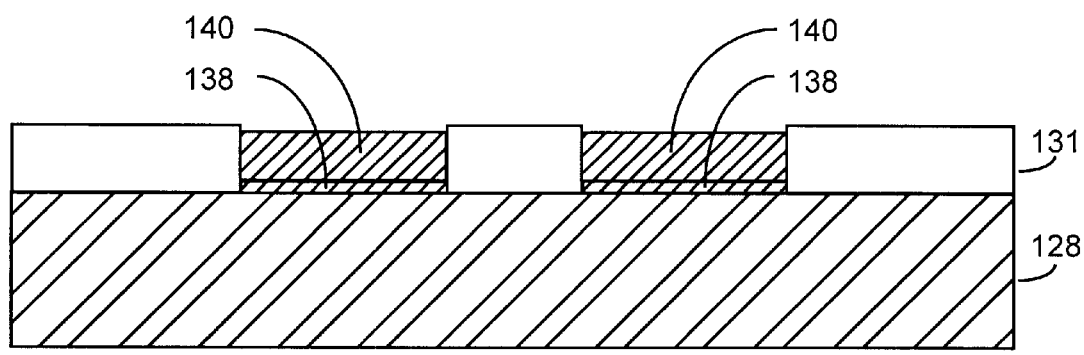
FIG. 13 is a schematic representation of the assembly shown in FIG. 8 after it has undergone the processes shown in FIGS. 10 through 12 causing both a thin seed layer and a thicker, less conductive layer to be deposited upon those portions of its dielectric surface which were exposed through holes in the patterned photoresist.

FIG. 13 illustrates the assembly shown in FIG. 8 once it has gone through the processes indicated in FIGS. 10 through 12. It shows that a thin seed layer 138 and a much thicker, less conductive ferromagnetic layer 140 have been deposited on the portions of the dielectric layer 128 which have not been covered by the photoresist 131.

Figure 14:
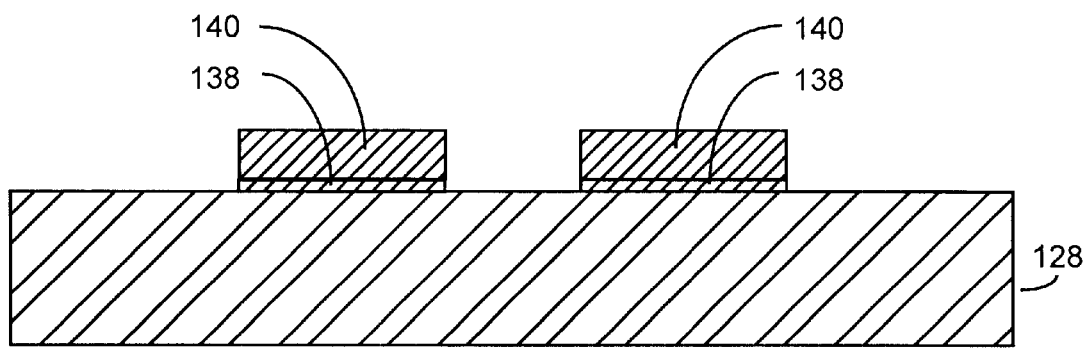
FIG. 14 shows the assembly of FIG. 13 after the photoresist his been removed so as to leave a ferromagnetic inductive core on the dielectric surface.

FIG. 14 illustrates the assembly of FIG. 13 after the photoresist layer 131 has been removed to leave a core such as a core 106 shown above with regard to FIGS. one through five.

In some embodiments, after a ferromagnetic material has been deposited by electroless plating a postdeposition thermal and/or oxidative treatment might be used to improve the properties of the deposited material.

The inventors have found that it is relatively easy to form ferromagnetic cores, such as ones of a nickel phosphorus alloy, by electroless deposition alone. But in some embodiments of the invention it is desirable to use electroplating. Electroplating has the advantage of plating material at a higher rate than electroless plating, and it can be more easily used to deposit a larger class of possible ferromagnetic materials, including nickel iron and nickel zinc alloys.

FIGS. 15 through 20 are used to illustrate how electroplating can be used to form ferromagnetic cores.

Figure 15:
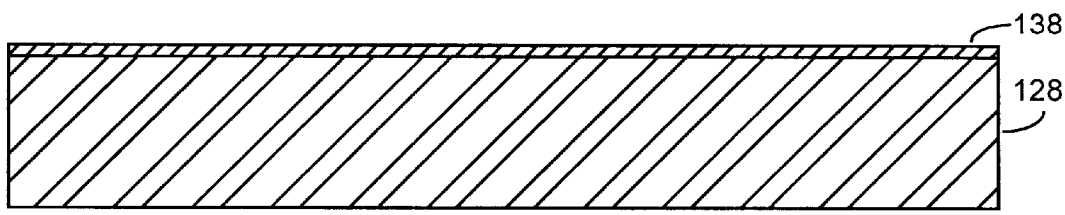
FIG. 15 is a schematic representation of a dielectric layer after having had a thin seed layer of conducting metal placed upon its surface.

FIG. 15 illustrates a layer of dielectric material 128 after a thin conductive seed layer 138 has been formed upon its by the process described with regard FIGS. 10 and 11. When used to form a ferromagnetic core through electroplating, the seed layer 138 can be of a metal to be used in that core, such as nickel, if the core is to be a nickel phosphorus or nickel boron alloy, or it can be another conductive material, such as copper. It is desirable that the seed layer be sufficiently conductive to act as a good electrode for the electroplating process, although its is also desirable that the seed layer's total conductivity be relatively low so as to reduce eddy currents once the inductive core has been constructed and is in use.

Figure 16:
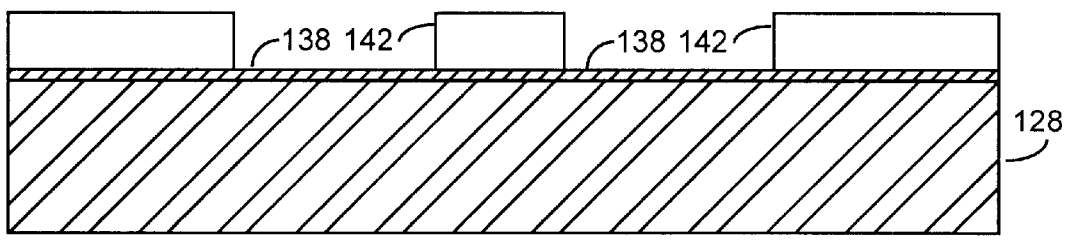
FIG. 16 is a schematic representation of the assembly shown in FIG. 13 after photoresist has been placed upon the surface of its seed layer and then has been patterned.

FIG. 16 shows the assembly of FIG. 15 after a layer of photoresist 142 has been deposited upon it and patterned to expose those portions of the seed layer 138 upon which a thicker layer of ferromagnetic material is to be plated.

Figure 17:
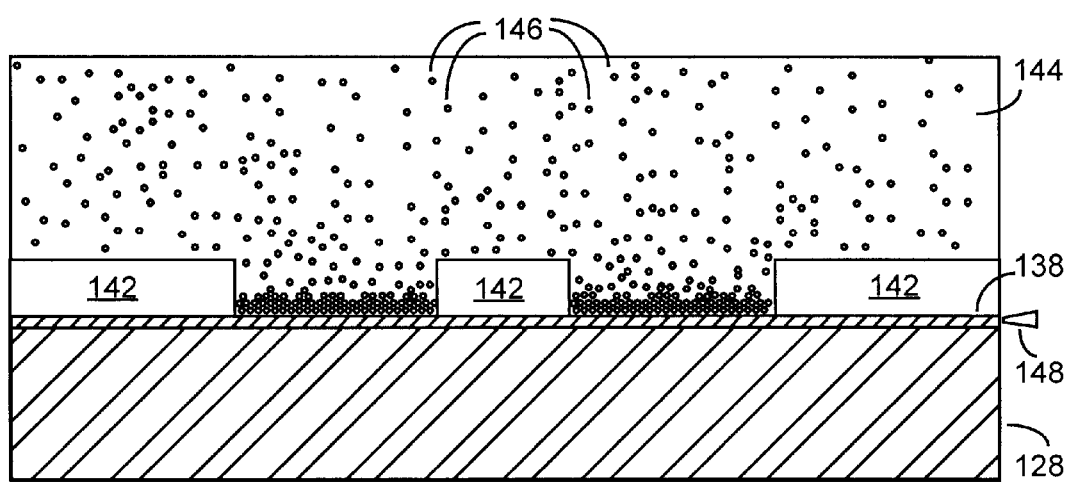
FIG. 17 is a schematic representation of the assembly shown in FIG. 16 while in an electroplating solution with an electrode attached to its seed layer to act as an electrode to cause electroplating of ferromagnetic material upon those portions of the seed layer exposed through holes in the photoresist.

FIG. 17 shows the assembly of FIG. 16 dipped into an electroplating solution 144 containing material 146 which is appropriate for plating a ferromagnetic material upon the seed layer. An electrical contact 148 is connected to the seed layer so as the cause the particles 146 to be attracted to the seed layer 138 and the portions of deposited material about it.

Figure 18:
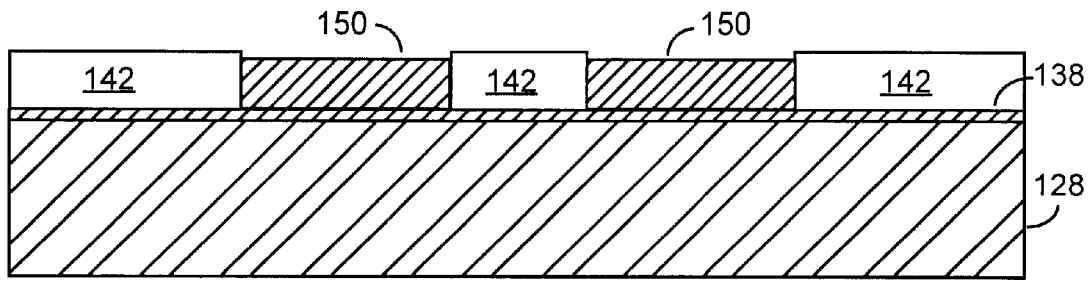
FIG. 18 is a schematic representation of the assembly shown in FIG. 17 after a relatively thick layer of ferromagnetic material has been deposited on portions of the seed layer not covered by photoresist.

FIG. 18 shows the assembly of FIG. 17 after his been removed from the solution 144 and a relatively thick layer of ferromagnetic material 150 has been deposited on the portions of the seed layer 138 not covered by the photoresist 142.

Figure 19:
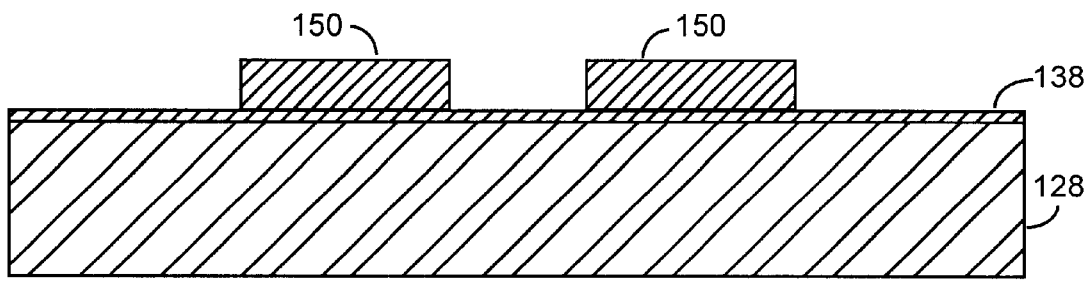
FIG. 19 is a schematic representation of the assembly shown in FIG. 17 after the photoresist has been removed from its surface.

FIG. 19 shows the assembly of FIG. 18 after the layer of photoresist 142 is been removed.

Figure 20:
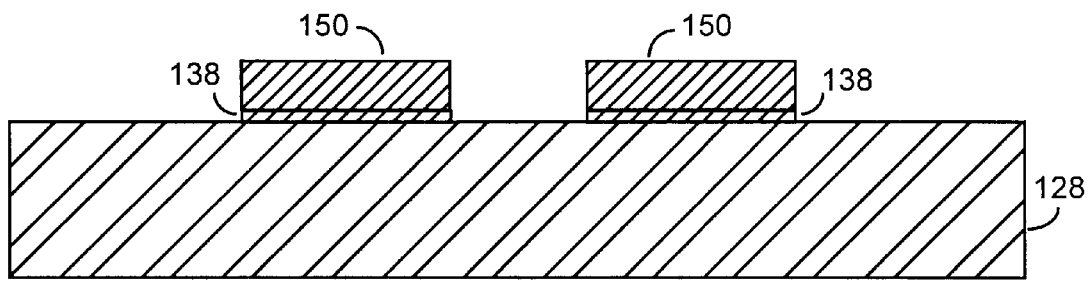
FIG. 20 is a schematic representation of the assembly shown in FIG. 18 after portions of the thin seed layer which have not been covered by the thicker layer of ferromagnetic material have been etched away.

FIG. 20 shows the assembly of FIG. 19 after those portions of the thin conducted seed layer 138 which are not covered by the thick layer of ferromagnetic mature 150 have been etched away, leaving a completed ferromagnetic core.

FIGS. 21 through 24 illustrate some of the many ways in which planar ferromagnetic cores can be assembled in printed circuit boards. In these schematic diagrams the vertical dimension is highly exaggerated and not drawn this scale and the space between the various layers 104 which are shown as being hollow are actually filled with adhesive material which hold the printed circuit boards' layers together.

Figure 21:
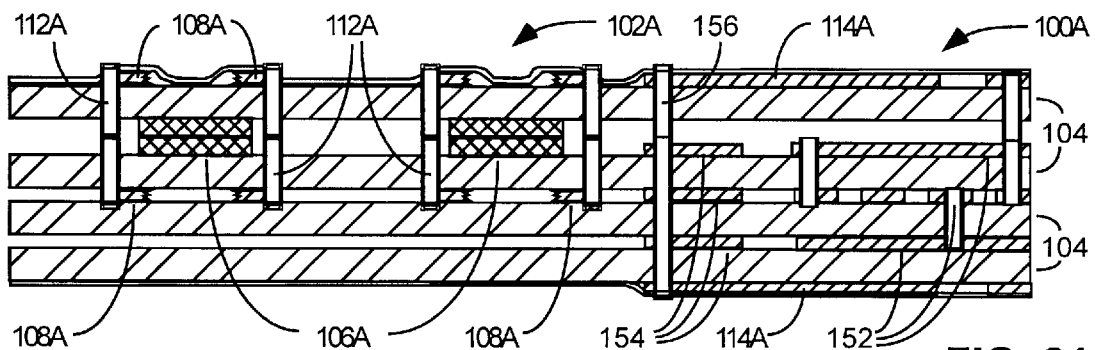
FIG. 21 is a schematic cross-sectional view of a four layer printed circuit board containing a planar inductor built into its layers as well as other circuitry which is shielded by copper shielding layers from the magnetic field generated by that inductor.

FIG. 21 illustrates a printed circuit board 100A in which a transformer 102A similar to that shown in FIGS. 1 through 5 is formed on two of the printed circuit board's four layers. This transformer has a core 106A, coil wiring 108A, and via 112A (to connect the winding layers above and below the core) that are similar to the core 106, wiring 108, and vias 112, respectively, shown in FIGS. 1 through 5.

This printed circuit board has other portions of circuit wiring 152 which are shielded from the electromagnetic field generated by the transformer 102A by layers of conductive material, such copper, 114A. Strips of conductive material 154 are also placed between the transformer and the other circuitry 152 and a via 156 is connected between them and the shields 114 a so as to further reduce the extent to which electromagnetic field generated by the transformer 102A has any effect upon the other circuitry 152.

Figure 22:
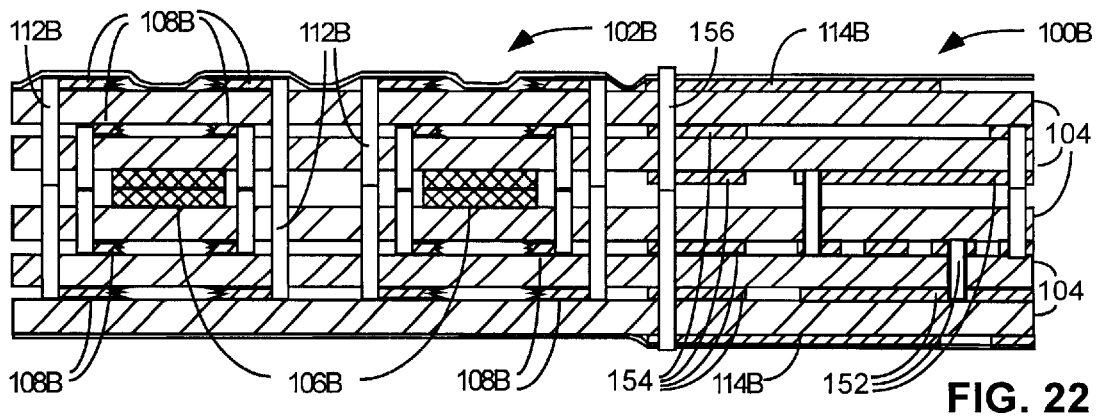
FIG. 22 is a schematic cross-sectional view of a printed circuit board that is similar to that shown in FIG. 23, except that its inductor has two layers of windings extending above and below its inductive core.

FIG. 22 illustrates a printed circuit board 100B that is substantially similar to that shown in FIG. 21 except that it has an additional layer and its transformer 102B has two layers, instead of one layer, of coil windings 108B both above and below it. This allows the transformer 102B to provide a better coupling between its primary and secondary windings. In alternate embodiment the number of coil windings layers both above and below the core could be even larger than two.

FIG. 23 illustrates a printed circuit board 100C that is substantially similar to that shown in FIG. 22 except that its ferromagnetic core 106C is formed of two layers which are separated by a layer 104B of the printed circuit board. In other embodiments of the invention the core to be formed of even more layers, each of which are separated from each other by one or more layers of a printed circuit board.

FIG. 24 illustrates a printed circuit board 100D that is substantially identical to that shown in FIG. 23 except that its core 106D has a thickness as great as the two printed circuit board layers 104C through which it expands. Such a core can be formed by drilling or etching a hole through the layers 104C, either before or after they have been bound together, and then filling that hole with the ferromagnetic material of the core 106D. This filling process can be performed by using either electroless plating or electroplating. The material of the core can also be stamped from a layer of ferromagnetic material or micromachines from a layer of that material and then inserted into its associated hole in the layers 104C.

FIGS. 25 through 27 illustrate that the planar ferromagnetic cores of the present invention are not limited to use on printed circuit boards, but can also be used on multichip modules, integrated circuits, and micro electromechanical machines ("MEMs").

FIG. 25 illustrates a multichip module which has been manufactured by process similar to that described in a U.S. patent application Ser. No. 09/904,306 entitled "Interconnect Circuitry, Multichip Module, And Methods For Making Them" filed Jul. 12, 2001, by Peter R. Nuytkens, Ilya E. Popeko, and Joseph M. Kulinets on the same day as this application (hereafter referred to as the '306 application.) The '306 application is hereby incorporated herein by reference in its entirety.

In the multichip module of FIG. 25 a plurality of integrated circuits, such as integrated circuits 162 and 164 are connected together by electrical interconnect layers such as layers 168. These conductive interconnect layers can also be used to form the windings 108E of a planar inductor 102E, which has a core 106E. This core can be formed on one of the dielectric layers 165 of the multichip module. The different layers of this winding can be connected together by vias 112E. The planar inductor cores 106E can be formed by electroless plating or electroplating of the type described above.

FIG. 26 illustrates that the planar inductors of the present invention can also be used in an integrated circuit, of which FIG. 26 illustrates only a portion. It shows a transformer 102F having an inductive core 106F that has been plated upon one of the dielectric layers 176 of the integrated circuit. The transformer has winding conductors 108F that formed coils out of portions of the conductive interconnect layers 176 of the integrated circuit. The integrated circuit has a substrate 172, such as one made of silicon crystal. A channel region of a transistor 178 is indicated in this substrate by dotted lines.

FIG. 27 is a schematic representation of a portion of a MEM's device 180. In this device the ferromagnetic cores 106G are used as cores of electromagnets 107. These electromagnets are used to move a relay contact 190 between one of two connectors, 188 and 192, respectively. Although not shown in the figure, the MEM device has multiple dielectric layers enabling a set of conductors to be formed below the core 106G. These lower conductors are connected through via holes with the conductors 112G to form an electrical winding around the core 106G. The winding of each electromagnet 107 is provided with current through leads 182. The electrical input that is to be switched by a relay is supplied through a lead 184, which connects to the moving contacts 190 of the relay. The switched output of the relay is conducted from one of the two leads 186 that connect to one of the relay's two stationary contacts 188 or 192.

In other MEM devices planar magnets, such as toroidal magnets, could be used to generate fields that are perpendicular to the surface of the MEM device.

Planar electro magnets and inductors can be used in MEM devices for many purposes, such as to make the windings of tiny electric motors; to change the position of mirrors, receivers, or emitters so as to switch the output of optical signals; to open and shut valves; and to measure magnetic field or current flows, just to name a few.

It should be understood that the foregoing description and drawings are given merely to explain and illustrate and that the invention is not limited thereto except insofar as the interpretation of the appended claims are so limited. Those skilled in the art who have the disclosure before them will be able to make modifications and variations therein without departing from the scope of the invention.

It should be understood that in other embodiments of certain aspects of the present invention the planar inductor cores could be formed by methods other than electroless plating or electroplating.

For example, planar ferromagnetic cores comprised of one or more toroidal or rectangular frames can be punched from a foil of metal alloy that has a high magnetic permeability (including materials such as, or similar to, Permalloy or Superalloy) and then be laminated between dielectric layers, such as those of a printed circuit board or a multichip module.

In other embodiments, ferromagnetic cores comprised of one or more toroidal or rectangular frames made of nickel, iron, or their alloy can be formed via physical or chemical vacuum deposition techniques on one or more dielectric layers.

In other embodiments, the ferromagnetic core can be comprised of one or more toroidal or rectangular frames that have been micromachines from a ferrite type of ceramic material and then placed in between or on the dielectric layer.

Aspects of the present invention make it possible to form ferromagnetic cores on a broad range of dielectric materials, including many smooth dielectric materials on which it has previously been difficult to perform such electroless plating.

This includes, to name just a few, FR4, polyimide, BT, Teflon, and latex. The electroless plating method using the catalytic particles discussed with regard FIG. 10 can also be used to electrolessly plate conductive layers or seed layers for electroplating of conductive layers, such as copper conductive layers, for use in the winding layers of the inductors formed by the present invention. The formation of conducting layers using such techniques is described in greater detail in the '306 application referenced above.

Not only do these aspects of the invention allow metal material to be deposited upon such dielectrics, they also allow this deposition to take place quickly, inexpensively, and at a sufficiently low-temperature to allow it to be used on assemblies containing materials which could not be submitted to such high-temperature metal deposition processes as sputtering. The materials that most printed circuit boards are made of are not suitable to high-temperature processes, such a sputtering, that have often been used in the prior art to form ferromagnetic cores. Many multichip modules also use dielectric layers made of materials that are not well suited for handling the high temperatures required for sputtering. Also dielectric such as polyimide is also commonly used in certain layers of integrated circuits, and thus the low temperature core deposition methods described above also have benefit in forming such circuitry. Such low temperature deposition can also be beneficial in manufacturing MEM devices, particularly those that are composed of materials that are not cable of standing high temperatures, such as plastic.

Those skilled the art will understand that the cores used the present invention can be toroidal, rectangular, or of any other shape appropriate for an inductor or magnetic core. The ferromagnetic cores of the invention can be used not only for transformers, but also for inductive circuit components, and for the cores of electromagnet. The invention's planar inductor's can be used for many of the applications which inductors, transformers, and electromagnets are currently used, including use in providing voltage isolation between various circuits, use in radio frequency mixers, use in Hall effects sensors, use in NMRe/PMR sensors, us in radio frequency ID tags, use in current sensors, use in isolated instrument amplifiers, and use in changing the resonant frequency of antennas.

What we claim is:

1. A printed circuit board comprising:
   two layers of dielectric material, each of the two dielectric layers having a pair of surfaces thereon;
   a core comprised of ferromagnetic material disposed between the two dielectric layers, said ferromagnetic core being plated on at least one surface of the two dielectric layers;
   a plurality of vias disposed through each of the two dielectric layers; and
   a plurality of conductive leads in the form of at least one conductive lead attached to each of the two dielectric layers, said conductive leads connected through the via holes so as to form a conducting coil around the core.

2. A printed circuit board as in claim 1 wherein the conductive leads form two separate coils around the same core so that one such coil can act as a primary winding and the other can act as a secondary winding of a transformer.

3. A printed circuit board as in claim 1, further comprising:
   a planar conducting sheet positioned with respect to the dielectric layers so as to shield other circuitry on the printed circuit board from magnetic fields generated around the core.

4. A printed circuit board as in claim 1, wherein the core further comprises two separate segments of ferromagnetic material, each disposed at a corresponding location on a facing surface of one of said two dielectric layers.

5. A printed circuit board as in claim 1 wherein the core has been formed at least in part by electroless plating.

6. A printed circuit board as in claim 1, wherein said core has been plated on the at least one surface of said dielectric layers by a process comprising:
   dipping the at least one surface in a solution containing catalytic metal particles which have a slight electrostatic dipole moment when in the solution to deposit a layer of catalytic metal particles on the at least one surface; and
   placing the at least one surface in a first metal salt solution in metastable equilibrium with a reducing agent so as to plate a layer of metallic material upon the at least one surface.

7. A printed circuit board as in claim 6, wherein the plating process further includes:
   roughening the at least one surface to create peaks and valleys in the at least one surface exhibiting van der Waal forces capable of attracting the catalytic metal particles.

8. A printed circuit board as in claim 6:
   wherein said layer of metallic material comprises a thin layer of relatively conductive metallic material used as a seed layer; and
   the plating process further includes, after the formation of said seed layer, placing the at least one surface in a second metal salt solution in metastable equilibrium with a reducing agent which has a higher concentration of non-metal elements than said first solution so as to plate upon the seed layer a ferromagnetic material layer having a lower conductivity than the conductivity of said seed layer.

9. A printed circuit board as in claim 6:
   wherein said layer of metallic material comprises a thin layer of relatively conductive metallic material used as a seed layer; and
   the plating process further includes using electroplating to plate a ferromagnetic material layer onto said seed layer having a lower conductivity than the conductivity of said seed layer.

10. A printed circuit board as in claim 1, wherein the at least one surface has a sufficient roughness so as to exhibit electrostatic forces.

11. A printed circuit board as in claim 1, wherein said core further comprises:
    a layer of catalytic metal particles electrostatically attracted to the at least one surface;
    a relatively thin layer of conductive metallic material deposited upon the layer of catalytic metal particles; and
    a layer of ferromagnetic material plated upon the thin layer of conductive metallic material and having a conductivity lower than the conductivity of the thin layer of conductive metallic material.

12. A printed circuit board as in claim 11, wherein the thin layer of conductive metallic material serves as an electrode in electroplating the less conductive layer of ferromagnetic material.

13. A printed circuit board as in claim 11, wherein the core has been formed at least in part by electroless plating.

* * * * *